United States Patent
Grosskreuz et al.

(10) Patent No.: US 7,914,367 B2
(45) Date of Patent: Mar. 29, 2011

(54) FRONT/REAR REMOVABLE FAN MOUNTING METHOD AND APPARATUS

(75) Inventors: Paul J. Grosskreuz, West Bend, WI (US); Walter Zukowski, Greendale, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 166 days.

(21) Appl. No.: 11/864,132

(22) Filed: Sep. 28, 2007

(65) Prior Publication Data

US 2009/0086429 A1    Apr. 2, 2009

(51) Int. Cl.
*H05K 5/00* (2006.01)
*B01D 50/00* (2006.01)

(52) U.S. Cl. ...................... 454/184; 55/385.6

(58) Field of Classification Search ............... 454/184; 55/385.6

See application file for complete search history.

(56) References Cited

U.S. PATENT DOCUMENTS

| 6,110,245 A * | 8/2000 | Schlag et al. ............. 55/385.6 |
| 6,236,564 B1 * | 5/2001 | Fan ............................... 361/695 |

\* cited by examiner

*Primary Examiner* — Steve McAllister
*Assistant Examiner* — Helena Kosanovic
(74) *Attorney, Agent, or Firm* — Fletcher Yoder LLP; Alexander R. Kuszewski; John M. Miller

(57) ABSTRACT

A fan assembly and mounting method is provided for mounting a fan within an electrical enclosure. The assembly includes a mounting assembly which houses the fan and can be removed from the exterior of the enclosure. The fan assembly also includes an interior mounting plate which can be detached from the mounting assembly to allow fan removal from the interior of the enclosure. Thus, the fan assembly allows the fan to be accessed from both the interior and exterior of the enclosure.

18 Claims, 4 Drawing Sheets

FRONT/REAR REMOVABLE FAN MOUNTING METHOD AND APPARATUS

BACKGROUND

The invention relates generally to the field of mounting fans for cooling electrical systems. More particularly, the invention relates to a novel configuration of a fan inside an electrical enclosure which allows the fan to be accessed from both the environment side of the enclosure and the interior of the enclosure.

Many applications exist for fan cooled electrical systems, particularly in industrial settings. For example, many systems employ drives to provide scalable control for high power applications including pumps and fans, extruders, conveyors, mixers, crushers, and centrifuges, to mention just a few. Environmental conditions often require isolation of the drives and their associated components such as control boards, terminal blocks, sensors, and fuses. When conditions dictate, electrical enclosures and housings are provided to support and protect the drives and components. During operation, fans are used to circulate air and cool the drives and components. These fans require routine maintenance; consequently, there is a need for quick access and easy replacement in order to reduce system downtime.

Existing products utilize fans that mount unidirectionally, typically from either the front or back of the drive. Front mounted fans are accessed from the interior of the enclosure. However, drive components, such as control boards and terminal blocks may need to be removed if they are located in front of the fan. Thus, front access generally requires partial teardown of the drive in order to perform fan maintenance. Alternatively, rear mounted fans are accessible from the exterior of the enclosure, allowing for maintenance without partial tear down of the drive. However, this access is impeded if the enclosure is placed against a wall. Consequently, both front and rear mount fans create maintenance challenges. Additionally, the fixed fan access point, determined by the mounting location, compels customers to plan for fan access during drive installation. For front mounted fans, the customer may need to allocate additional maintenance time to allow for partial disassembly of the drive. For rear mounted fans, the customer may need to include additional space behind the drive to allow for access.

There is a need, therefore, for improved designs for fan mounting systems which allow the fan to be accessed from both the exterior and interior of the enclosure. This dual access will create greater drive installation flexibility by permitting fan access from either the front or back of the drive, as necessary. Additionally drives may be relocated as needed without being constrained by access requirements.

BRIEF DESCRIPTION

The invention provides a novel fan assembly designed to respond to such needs. The assembly may find application in a wide range of fields, but is particularly well-suited to mounting a fan within an electrical enclosure containing a motor drive. In general, the fan assembly includes a mounting assembly which encloses a fan. When mounted within an electrical enclosure, the fan may be accessed from the exterior of the enclosure by removing the mounting assembly containing the fan. The fan also may be accessed from the interior of the enclosure by removing a mounting plate to which the fan may be mounted or secured behind. Mounting the fan assembly on the rear panel of an enclosure allows access from both the front interior and rear exterior of the enclosure. Alternatively, where there is a need for locating the enclosure against a wall, the fan assembly may be mounted on a side panel of the enclosure to allow access from the side exterior as well as the interior of the enclosure.

In a particular implementation disclosed below, the mounting assembly includes a mounting box which may be secured to the exterior of the enclosure. The mounting box contains an aperture for bringing air into the enclosure from the environment. A plenum extends from the mounting box into the enclosure. The fan may then be inserted into the plenum and secured using an interior mounting plate. To cool components within the enclosure, the fan draws air from outside the enclosure and circulates the air within the enclosure. When maintenance on the fan is necessary, the fan may be accessed from both the interior and exterior of the enclosure. For interior access, the interior mounting plate may be removed from the fan assembly exposing the plenum which surrounds the fan. For exterior access, the mounting assembly may be removed as a single unit. After removal, the interior mounting plate may be removed from the fan assembly to expose the plenum and fan. Thus, the fan mounting technique allows maintenance to be completed on a fan from both the interior and exterior of the enclosure.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
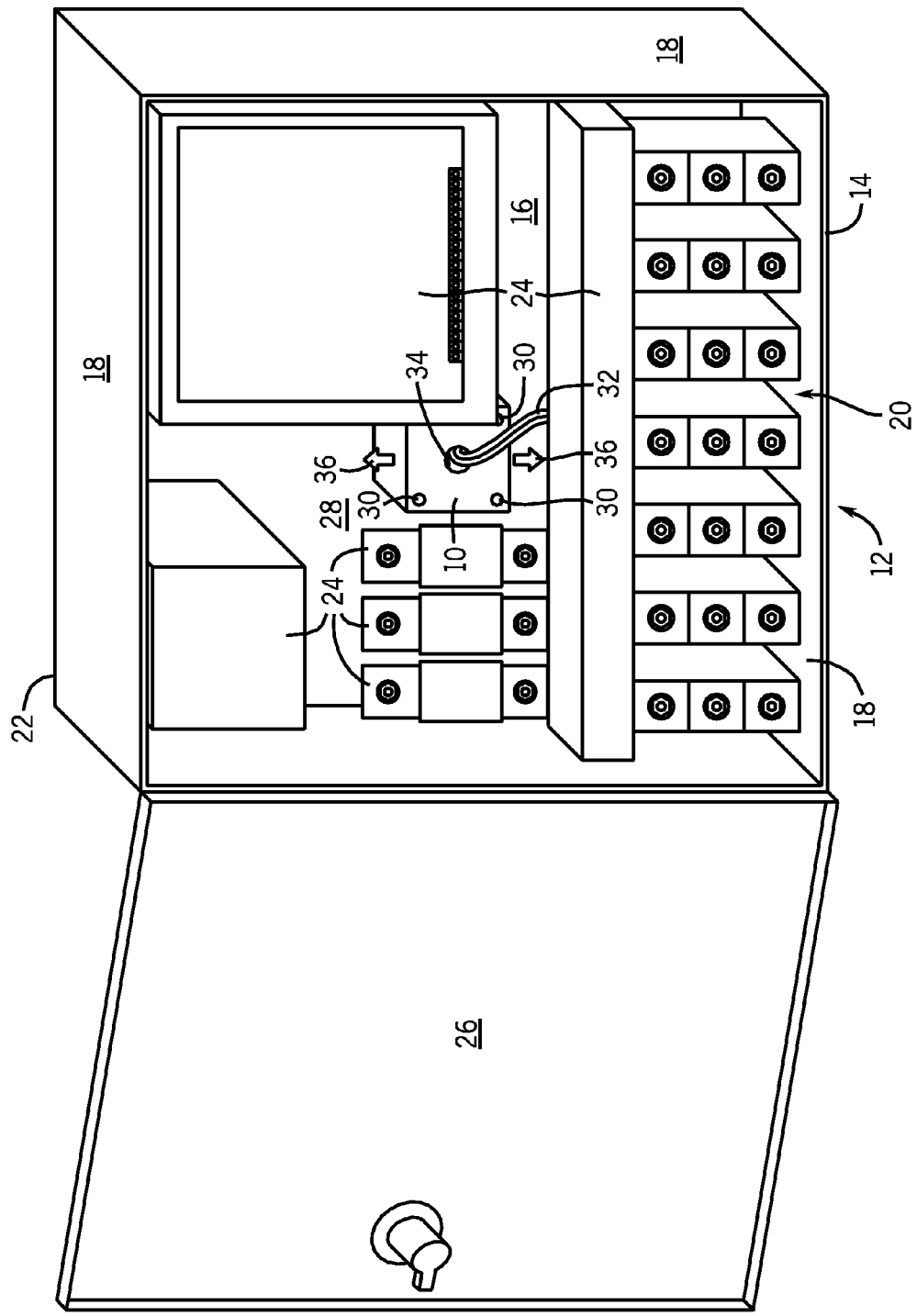
FIG. 1 is a view of a portion of an electrical system viewed from within an enclosure and illustrating placement of a cooling fan assembly in accordance with aspects of the invention.

Turning now to the drawings, FIG. 1 illustrates a fan assembly 10 contained within an electrical system 12. The electrical system 12 is located within an enclosure 14, which provides a barrier between the interior volume 16 of the enclosure 14 and the outside environment. The enclosure 14 may be any suitable electrical enclosure which houses the interior volume 16. For example, the enclosure may be constructed of materials such as metal or fiberglass and may be a free standing cabinet or a wall mounted housing. Additionally, the enclosure may be a modular system integrated within a control system. As one skilled in the art will appreciate, in some applications, the enclosure may be NEMA 12 rated for use in a production environment.

The interior volume 16 of the enclosure 14 is encased by sides 18, a front 20, and a rear 22, which surround components 24 for the electrical system 12. The front 20 of the enclosure 14 contains an opening over which a door 26 may be closed. The door 26 allows access to the components 24 contained within the enclosure 14. In the illustrated embodiment, the interior volume 16 contains an electrical system 12 for a motor drive. Although the technique may be used with any type of electrical system, a presently contemplated application for which it is particularly well suited is 600 to 1,000 amperage motor drives. Components 24 of the motor drive include control boards, terminal blocks, fuses, and sensors, just to name a few. The components 24 are mounted to the rear panel 28 and are connected by electrical wiring. The fan assembly 10 also is mounted to the rear panel 28 with fasteners 30. A wire harness 32 may be used to channel power to the fan assembly 10 through an aperture 34. The wire harness may terminate at a terminal block or other power source. Typical power sources include 120 volt or three-phase 480 volt power. The fan assembly 10 directs air flow 36 throughout the enclosure 14 to circulate air and dissipate heat way from the components 24. As depicted in FIG. 1, some of the components 24 must be removed in order to access the fan assembly 10 from the front 20 of the enclosure 14. The inventive technique accommodates such arrangements by allowing the fan assembly 10, alternatively, to be accessed from the rear 22 of the enclosure 14, as discussed below. It should be noted that various sizes of fan assemblies and enclosures may be envisaged, and that described herein is merely intended to be an exemplary arrangement.

Figure 2:
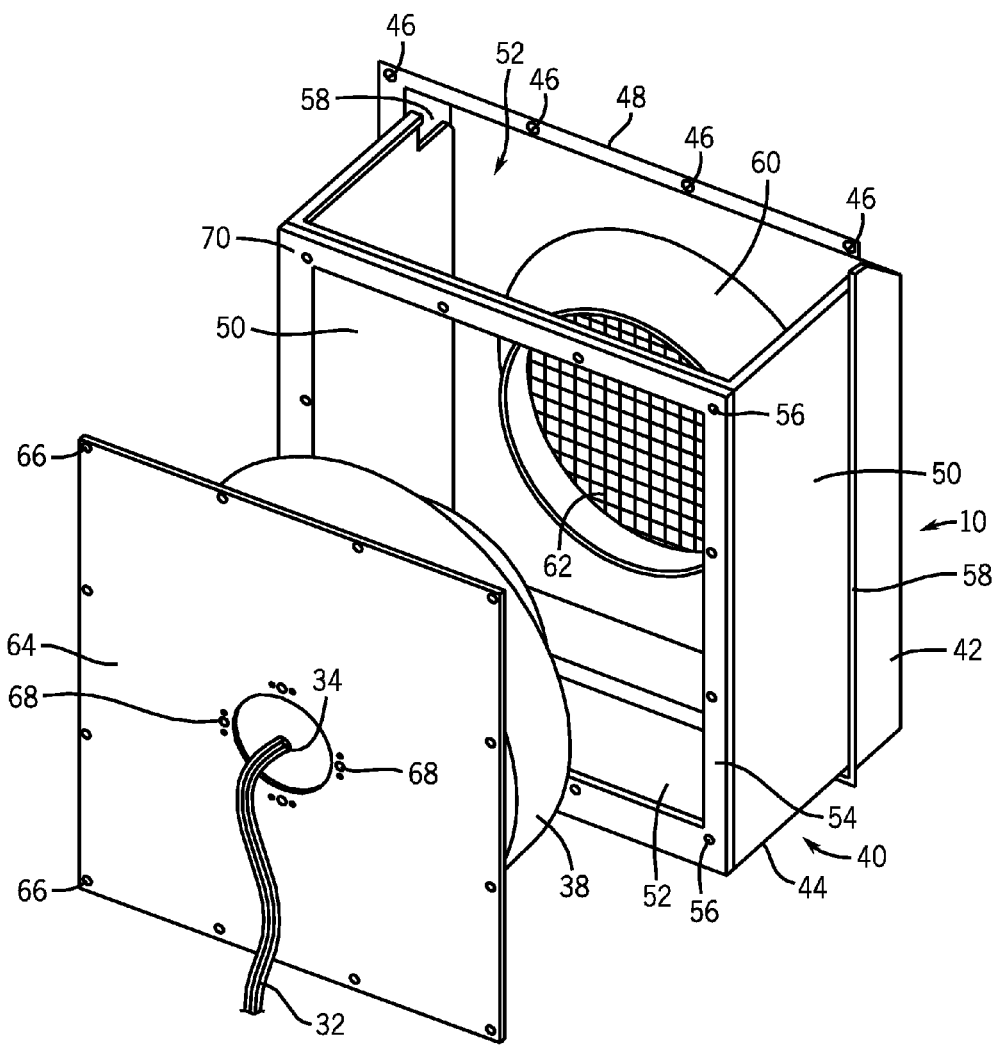
FIG. 2 is an exploded perspective view of an exemplary fan assembly in accordance with aspects of the invention for mounting in an enclosure of the type shown in FIG. 1.

FIG. 2 is an exploded view of an exemplary fan assembly 10 for mounting in an enclosure of the type shown in FIG. 1. The fan assembly 10 includes a fan 38 which may be inserted into a mounting box 40. The mounting box 40 contains an exterior mounting plate 42 which may be secured to the enclosure. The exterior mounting plate may be disposed on any exterior wall of the enclosure. A plenum 44 extends from the exterior mounting plate 42 and surrounds the fan 38 when the fan assembly is assembled. The exterior mounting plate 42 also contains apertures 46 located on a peripheral flange 48 which may be used to secure the exterior mounting plate 42 to the enclosure. The flange 48 may be fabricated by any suitable metal working technique. By way of example, the flange 48 may be spot welded to the exterior mounting plate or formed from sheet metal stock when the exterior mounting plate is created. Alternatively, the elements of the mounting structure, such as box 40, mounting plate 42, or any other component, may be made of non-metallic materials, composite materials, and the like.

In one embodiment, a portion of the flange 48 is disposed parallel to sidewalls 50 of the plenum 44. The mounting box 40 may be secured to the enclosure so that the sidewalls extend into the enclosure adjacent to the interior sides of the enclosure. The portion of the flange parallel to the sidewalls 50 may be disposed over the exterior sides of the enclosure to secure the mounting box 40. Another portion of the flange contains apertures 46 and extends vertically from the exterior mounting plate 42 adjacent to open ends 52 of the plenum 44. Fasteners may be inserted through the apertures 46 to secure the mounting box 40 to the enclosure 14. In other embodiments the flange may be disposed within the enclosure or be replaced by other attachment methods such as brackets or hooks.

The plenum 44 includes sidewalls 50 used to direct air through open ends 52. The exterior mounting plate 42 includes an aperture for admitting air from the environment into the fan. When the assembled mounting box 40 is placed within the enclosure, air from the environment enters the fan through the exterior mounting plate aperture and is blown out radially by the fan 38. The sidewalls 50 direct the air generated by the fan 38 through the open ends 52. It should be noted that the open ends 52 may be replaced by vents or grates and may be located in the sidewalls. In some embodiments, the open end at the bottom of the plenum 44 may be disposed over the interior of the enclosure allowing the air to be directed upward. The plenum also includes a rear frame 54 which provides a base for mounting the fan 38 within the mounting box 40. The rear frame 54 includes apertures 56 which are used to secure the fan 38 within the mounting box 40.

In some embodiments the mounting box may include additional features. For example, a joint or gasket 58 may exist between the sidewalls 50 of the plenum 44 and the exterior mounting plate 42 in order to provide additional stability when securing the mounting box to an enclosure, and for sealing certain passages and reducing vibration or noise. An inlet ring 60 may be disposed within the mounting box in order to channel air from the environment into the fan 38. Additionally, a finger guard 62 (or grill, louvers, etc.) may enclose the exterior mounting plate aperture.

The fan assembly 10, as shown in FIG. 2, also includes an interior mounting plate 64. Apertures 66 on the interior mounting plate 64 align with the apertures 56 located on the rear frame 54 of the mounting box and may be used to secure the interior mounting plate 64 to the mounting box 40. As an additional feature, a seal 70 may be disposed between the rear frame 54 and the interior mounting plate 64. The fan may be secured to the interior mounting plate 64 by way of apertures 68 located on the interior mounting plate 64. In other embodiments, the fan may be secured to the sidewalls 50 and accessed by the interior mounting plate 64. As noted above, an aperture 32 in the interior mounting plate 64 allows for a wire harness 32 to be routed from the fan 10 to the interior of the enclosure. Although the wire harness 32 is depicted passing through the interior mounting plate 64, the wire harness 32 also may be routed through the open ends 52 or apertures located in the sidewalls.

Figure 3:
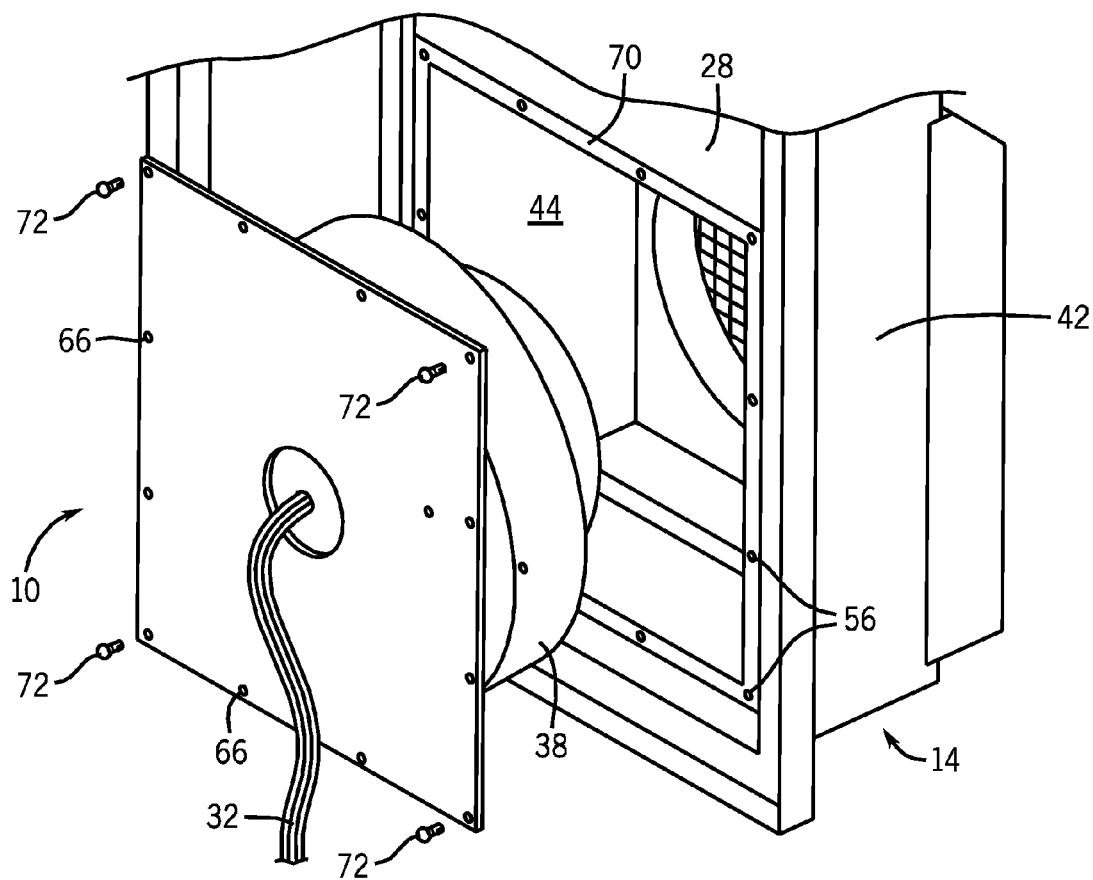
FIG. 3 is a partially exploded perspective view of the fan assembly of FIG. 2 with the fan being removed from a front or interior side of the assembly.

As noted above, the fan may be accessed from both the interior and exterior sides of the enclosure. FIG. 3 depicts the fan assembly of FIG. 2 with the fan 38 being removed from the interior side of the enclosure 14. In FIG. 3, the exterior mounting box 42 has been secured to the enclosure 14 with the plenum 44 disposed within the enclosure 14. The fan 38 has been secured to the interior mounting plate 64. As shown in FIG. 3, the fan 38 may be accessed from the interior side of the enclosure by removing both the interior mounting plate 64 and the fan 38 from the mounting box 40. The fasteners 72, which were used to secure the interior mounting plate 64 to the rear frame 54, have been removed, allowing the interior mounting plate 64, with the fan 38 attached to it, to be removed from the enclosure 14. Once removed, the fan 38 may then be detached from the interior mounting plate 64 for repair or replacement.

Figure 4:
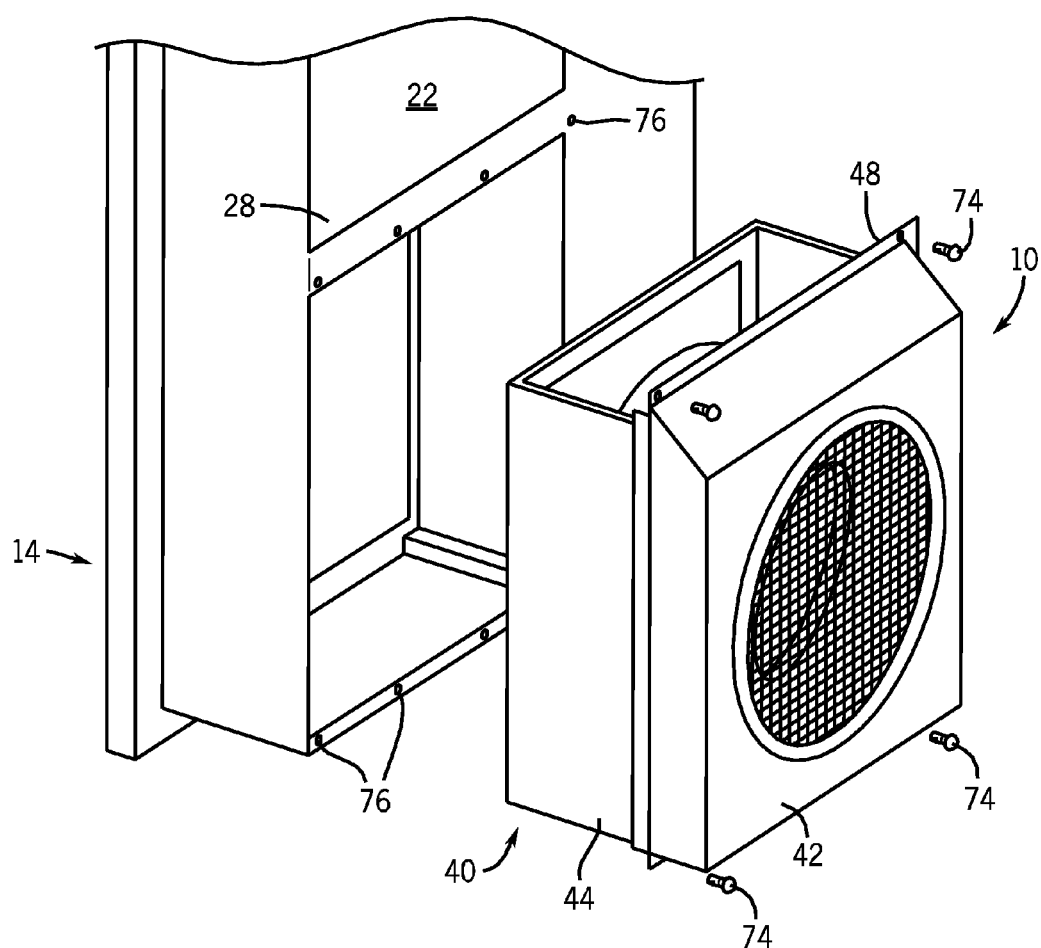
FIG. 4 is a partially exploded perspective view of the fan assembly of FIG. 2 with the fan assembly being removed from a rear or exterior side of the enclosure.

FIG. 4 depicts the fan assembly of FIG. 2 with the fan 10 being removed from the exterior side of the enclosure. In FIG. 4, the interior mounting plate 64 and fan 38 have been secured to the mounting box 40. The fasteners 74 securing the mounting box 40 to the enclosure rear 22 have been removed, allowing the entire mounting box 40, containing the fan 38, to be removed from the enclosure 14. After removal from the enclosure 14, the interior mounting plate 64 may be detached from the mounting box 40 in order to access the fan 38.

The resulting fan mounting method provides an increased degree of maintenance flexibility by allowing the fan to be accessed from both the interior and exterior of the electrical enclosure. While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A fan assembly for an electrical enclosure comprising:
a mounting assembly including a mounting box securable to an exterior surface of the enclosure, an interior mounting plate secured to the mounting box, and a seal disposed between the mounting box and the interior mounting plate, the mounting box forming a plenum; and
a fan secured to the interior mounting plate and received within the mounting box and configured to draw air through the plenum of the mounting box between an environment and an interior volume of the enclosure, the fan being removable with the interior mounting plate from within the enclosure while the mounting box remains secured to the exterior surface of the enclosure and removable with the mounting assembly from outside the enclosure without access to the inside of the enclosure.

2. The fan assembly of claim 1, wherein the box includes an exterior mounting plate and the plenum extending from the exterior mounting plate into the interior volume of the enclosure, the interior mounting plate being secured to the plenum.

3. The fan assembly of claim 2, wherein the plenum is permanently secured to the exterior mounting plate.

4. The fan assembly of claim 2, wherein the plenum extends into the enclosure and the exterior mounting plate extends outside the enclosure.

5. The fan assembly of claim 3, wherein the exterior mounting plate includes a flange securable to the exterior surface of the enclosure via fasteners.

6. The fan assembly of claim 3, wherein the plenum includes side walls and openings for directing air to or from the fan.

7. The fan assembly of claim 3, wherein the plenum includes side walls, an opening at the rear for directing air to the fan, an opening at a first side between the side walls for directing air from the fan, and an opening at a second side between the side walls, wherein the second side is disposed over an interior surface of the enclosure and is opposite of the first side.

8. The fan assembly of claim 1, wherein the interior mounting plate is secured to the mounting box via fasteners inserted from a side of the interior mounting plate opposite the fan.

9. The fan assembly of claim 1, comprising a finger guard secured to the mounting box over an opening of the mounting box through which air is directed.

10. The fan assembly of claim 1, comprising an inlet ring secured to the interior of the mounting box encircling an opening of the mounting box through which air is directed.

11. A fan assembly for an electrical enclosure comprising:
a mounting assembly including a mounting box forming a plenum and securable to the enclosure and accessible from outside of the enclosure, and an interior access plate secured to the mounting box within the enclosure; and
a fan received within the mounting box and securable within the enclosure and configured to draw air through the plenum of the mounting box from an environment outside the enclosure to an interior volume of the enclosure, the fan being capable of being detached from the mounting box from within the enclosure and removable with the mounting assembly from outside the enclosure without access to the inside of the enclosure, wherein the interior access plate includes an aperture for permitting the passage of electrical leads from the fan.

12. The fan assembly of claim 11, comprising:
a seal disposed between the mounting box and the interior access plate;
a finger guard secured to the mounting box over an opening of the mounting box through which air is directed; and
an inlet ring secured to the interior of the mounting box over an opening of the mounting box through which air is directed.

13. The fan assembly of claim 11, wherein the fan is secured to the interior access plate, the fan being removable with the interior access plate from within the enclosure.

14. The fan assembly of claim 11, wherein the fan is secured to the mounting box, the fan being removable with the mounting box from outside the enclosure and removable via the access plate from within the enclosure.

15. The fan assembly of claim 14, wherein the box comprises:
an exterior mounting plate, and wherein the plenum extends from the exterior mounting plate into the interior volume of the enclosure, the interior access plate being secured to the plenum on the enclosure side of the plenum.

16. The fan assembly of claim 15, wherein the interior access plate includes an aperture for permitting the passage of electrical leads from the fan therethrough.

17. A method for mounting a fan within an electrical enclosure comprising:
disposing a fan to a first side of an interior mounting plate, the interior mounting plate having an aperture for permitting the passage of electrical leads from the fan therethrough;
disposing a finger guard to a first side of an exterior mounting plate over an aperture in the exterior mounting plate, the exterior mounting plate having an inlet ring on a second side thereof encircling the aperture in the exterior mounting plate;
disposing a plenum on the second side of the exterior mounting plate, wherein the plenum includes sidewalls and an opening opposite the inlet ring to allow for insertion of the fan inside the plenum;
disposing the interior mounting plate adjacent to the plenum so that the fan is inserted into the plenum in-line with the inlet ring and the interior mounting plate is removable from a second side of the interior mounting plate; and
disposing the exterior mounting plate to an environment side of the enclosure so that the plenum is located within the enclosure, the exterior mounting plate and fan are removable from the environment side of the enclosure without access to the interior side of the enclosure, and the interior mounting plate and fan are removable from an interior side of the enclosure while the plenum remains secured to the enclosure.

18. The method of claim 17, wherein the steps are performed in the order set forth in claim 17.

* * * * *